United States Patent
Chu et al.

(10) Patent No.: US 6,934,181 B2
(45) Date of Patent: Aug. 23, 2005

(54) REDUCING SUB-THRESHOLD LEAKAGE IN A MEMORY ARRAY

(75) Inventors: Sam Gat-Shang Chu, Round Rock, TX (US); Peter Juergen Klim, Austin, TX (US); Michael Ju Hyeok Lee, Austin, TX (US); Jose Angel Paredes, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 259 days.

(21) Appl. No.: 10/361,200

(22) Filed: Feb. 6, 2003

(65) Prior Publication Data

US 2004/0156227 A1 Aug. 12, 2004

(51) Int. Cl.[7] .................................................. G11C 7/00
(52) U.S. Cl. .......................................... 365/154; 356/72
(58) Field of Search ............................. 365/154, 63, 72

(56) References Cited

U.S. PATENT DOCUMENTS

| | | | |
|---|---|---|---|
| 3,978,577 A | 9/1976 | Bhattacharyya et al. ...... 29/571 |
| 4,679,172 A | 7/1987 | Kirsch et al. ............... 365/222 |
| 5,850,090 A | 12/1998 | Oashi et al. ................. 257/296 |
| 5,856,945 A | 1/1999 | Lee et al. ................. 365/185.3 |
| 5,936,902 A | 8/1999 | Hsu et al. .................... 365/201 |
| 5,970,018 A | * 10/1999 | Iwata et al. ............ 365/230.06 |
| 5,999,442 A | * 12/1999 | Van Der Sanden et al. . 365/154 |
| 6,001,706 A | 12/1999 | Tan et al. .................... 438/424 |
| 6,025,935 A | 2/2000 | Tseng ......................... 358/483 |
| 6,246,265 B1 | 6/2001 | Ogawa ......................... 326/95 |
| 6,359,311 B1 | 3/2002 | Colinge et al. ............. 257/347 |
| 6,472,274 B1 | 10/2002 | Golz et al. .................. 438/270 |
| 6,744,659 B1 | * 6/2004 | Eby et al. ................... 365/154 |

* cited by examiner

*Primary Examiner*—Tan T. Nguyen
(74) *Attorney, Agent, or Firm*—Robert A. Voigt, Jr.; Winstead Sechrest & Minick P.C.; Casimer K. Salys

(57) ABSTRACT

A method and memory array for reducing sub-threshold leakage in a memory array. A memory array may include a plurality of rows where each row may include one or more groups of cells. Within each group of cells, each cell may be coupled to a ground path and to a power path. A device, e.g., n-type transistor, p-type transistor, may be coupled to either the ground or power path in each group of cells thereby permitting the passing of the sub-threshold leakage from those cells in that group through the device. Consequently, the sub-threshold leakage in the memory array may be reduced.

16 Claims, 5 Drawing Sheets

REDUCING SUB-THRESHOLD LEAKAGE IN A MEMORY ARRAY

TECHNICAL FIELD

The present invention relates to the field of memory array devices, and more particularly to reducing sub-threshold leakage in memory arrays, e.g., Static Random Access Memory (SRAM).

BACKGROUND INFORMATION

Memory array devices, e.g., Static Random Access Memory (SRAM), may be used in digital computer systems to store and retrieve electronic data at highs speeds. Each item of data in memory arrays, called a bit, is stored in a separate circuit or device commonly referred to as a "cell." Since computers use binary format to represent data, each cell can store one of two possible values (on or off). A typical memory array comprises millions of bits organized as an array consisting of horizontal rows and vertical columns. Each cell shares electrical connections with the other cells in its row and column. The horizontal lines connected to all cells in a row are called word lines, and the vertical lines (along which data flows into and out of the cell) are called data or bit lines. Cells are therefore accessed by proper selection of the word and bit lines.

Power consumption of a memory array may be made up of two components, dynamic power consumption and leakage power consumption. Dynamic power consumption relates to the power that is consumed when a particular word line is accessed to read from or write data to a cell. In an SRAM, only one particular word line is accessed at a particular time. The leakage power consumption may occur when a cell is not accessed but power continues to be consumed based on the leakage current which flows through the transistors, in the off state, that make up the cell. Hence, at any given time, every cell in all but one word line or the entire memory array may not be accessed and subject to leakage power consumption.

Leakage power consumption may include what is commonly referred to as "sub-threshold leakage." Sub-threshold leakage may refer to the current that flows in the channel of the transistor when the transistor is deactivated, i.e., turned off. Sub-threshold leakage may have an exponential dependency on the threshold voltage divided by thermal energy (kT). Hence, as the threshold voltage is decreased, the sub-threshold leakage is increased. Further, sub-threshold leakage may have a dependency on the channel length. As the channel length of the transistor is decreased, the sub-threshold leakage may be increased.

Sub-threshold leakage has become a major design concern for memory arrays as the transistors in each cell become smaller in size, i.e., as the channel length continues to decrease, due to technological innovations.

Therefore, there is a need in the art to reduce sub-threshold leakage in memory arrays such as SRAM.

SUMMARY

The problems outlined above may at least in part be solved in some embodiments by passing sub-threshold leakage of a plurality of memory cells through a device, e.g., n-type transistor, p-type transistor, inserted in a ground path and/or a power path of the plurality of memory cells.

In one embodiment of the present invention, a method for reducing sub-threshold leakage in a memory array may comprise the step of inserting a device, e.g., n-type transistor, p-type transistor, into either a ground path or a power path coupled to a plurality of cells in the memory array where the plurality of cells are configured to store data. The sub-threshold leakage of the plurality of cells may be passed through the device thereby reducing the sub-threshold leakage in the memory array.

The foregoing has outlined rather broadly the features and technical advantages of one or more embodiments of the present invention in order that the detailed description of the invention that follows may be better understood. Additional features and advantages of the invention will be described hereinafter which form the subject of the claims of the invention.

BRIEF DESCRIPTION OF THE DRAWINGS

A better understanding of the present invention can be obtained when the following detailed description is considered in conjunction with the following drawings, in which.

DETAILED DESCRIPTION

The present invention comprises a memory array and method for reducing sub-threshold leakage in a memory array. In one embodiment of the present invention, a memory array comprises a plurality of rows where each row may comprise one or more groups of cells. Within each group of cells, each cell may be coupled to a ground path and to a power path. A device, e.g., n-type transistor, p-type transistor, may be coupled to either the ground or power path in each group of cells thereby permitting the passing of the sub-threshold leakage from those cells in that group through the device. Consequently, the sub-threshold leakage in the memory array may be reduced. It is noted that even though the following description describes embodiments reducing sub-threshold leakage in an SRAM that the principles of the present invention may be applied to any type of memory array. It is further noted that such embodiments applying the principles of the present invention to different types of memory arrays would fall within the scope of the present invention. Furthermore, it is noted that the following describes the present invention in connection with an SRAM comprising multiple groups of cells in a word line separated from one another via a gap area where each cell is a typical six-transistor memory cell for ease of understanding. An example of such a typical six-transistor memory cell is described below in connection with FIG. 1.

In the following description, numerous specific details are set forth to provide a thorough understanding of the present invention. It should be noted, however, that those skilled in the art are capable of practicing the present invention without such specific details. In other instances, well-known circuits have been shown in block diagram form in order not to obscure the present invention in unnecessary detail.

FIG. 1—Memory Cell

Figure 1:
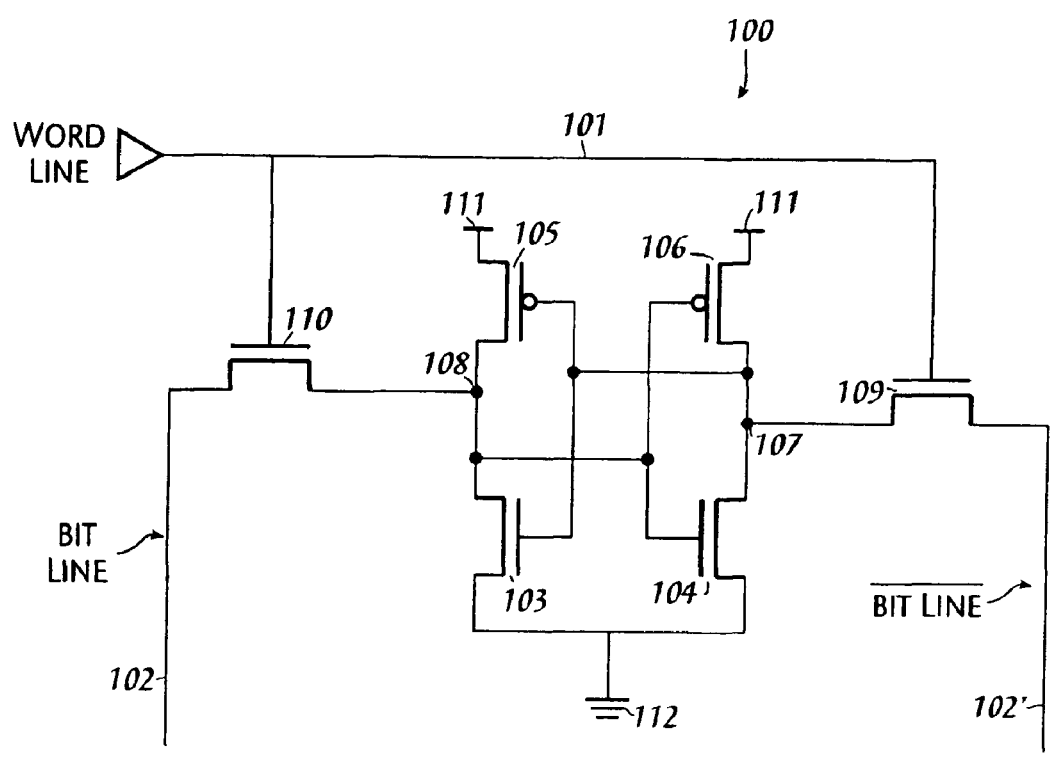
FIG. 1 illustrates a typical memory cell in a memory array in accordance with the principles of the present invention.

FIG. 1 illustrates a typical six-transistor memory cell 100 in an SRAM. Memory cell 100 may comprise a word line 101 and a pair of bit lines 102, 102' for both writing and reading data where bit line 102' is the complement of bit line 102. Word line 101 may refer to a horizontal line electrically connected to all cells 100 in a row (not shown in FIG. 1) in a memory array such as SRAM. Word line 101 may be coupled to the gates of n-type transistors 109, 110. The drain of transistor 110 and source of transistor 109 may be coupled to bit lines 102, 102', respectively. The source of transistor 110 may be coupled to node 108 commonly referred to as the "true node." Node 108 may be coupled to the drain of p-type transistor 105 and n-type transistor 103. The source of transistor 105 may be coupled to power 111. The source of transistor 103 may be coupled to ground 112. The gate of transistor 105 may be coupled to the drain of p-type transistor 106. The source of transistor 106 may be coupled to power 111 and the drain of transistor 106 may be coupled to node 107 commonly referred to as the "complement node." Further, the gate of transistor 106 may be coupled to the gate of n-type transistor 104. The drain of transistor 104 may be coupled to node 107 and the source of transistor 104 may be coupled to ground 112.

Referring to FIG. 1, when a high voltage is applied to the gates of transistors 104 and 106, transistor 104 will conduct while transistor 106 will not. When a low voltage is applied to the gates of transistors 104 and 106, transistor 106 will conduct while transistor 104 will not. Consequently, memory cell 100 will store data by latching either a high voltage at node 107 and a low voltage at node 108, or a low voltage at node 107, and a high voltage at node 108.

When a gate voltage applied to enable word line 101 causes transistors 109 and 110 to conduct, data in memory cell 100 can be read out on lines 102, 102'. Alternatively, data can be written into cell 100 on lines 102, 102'.

Additional details regarding a typical six-transistor memory cell 100 in an SRAM are disclosed in U.S. Pat. No. 5,890,215, entitled "Electronic Computer Memory System Having Multiple Width, High Speed Communication Buffer", which is hereby incorporated herein by reference in its entirety.

Figure 2:
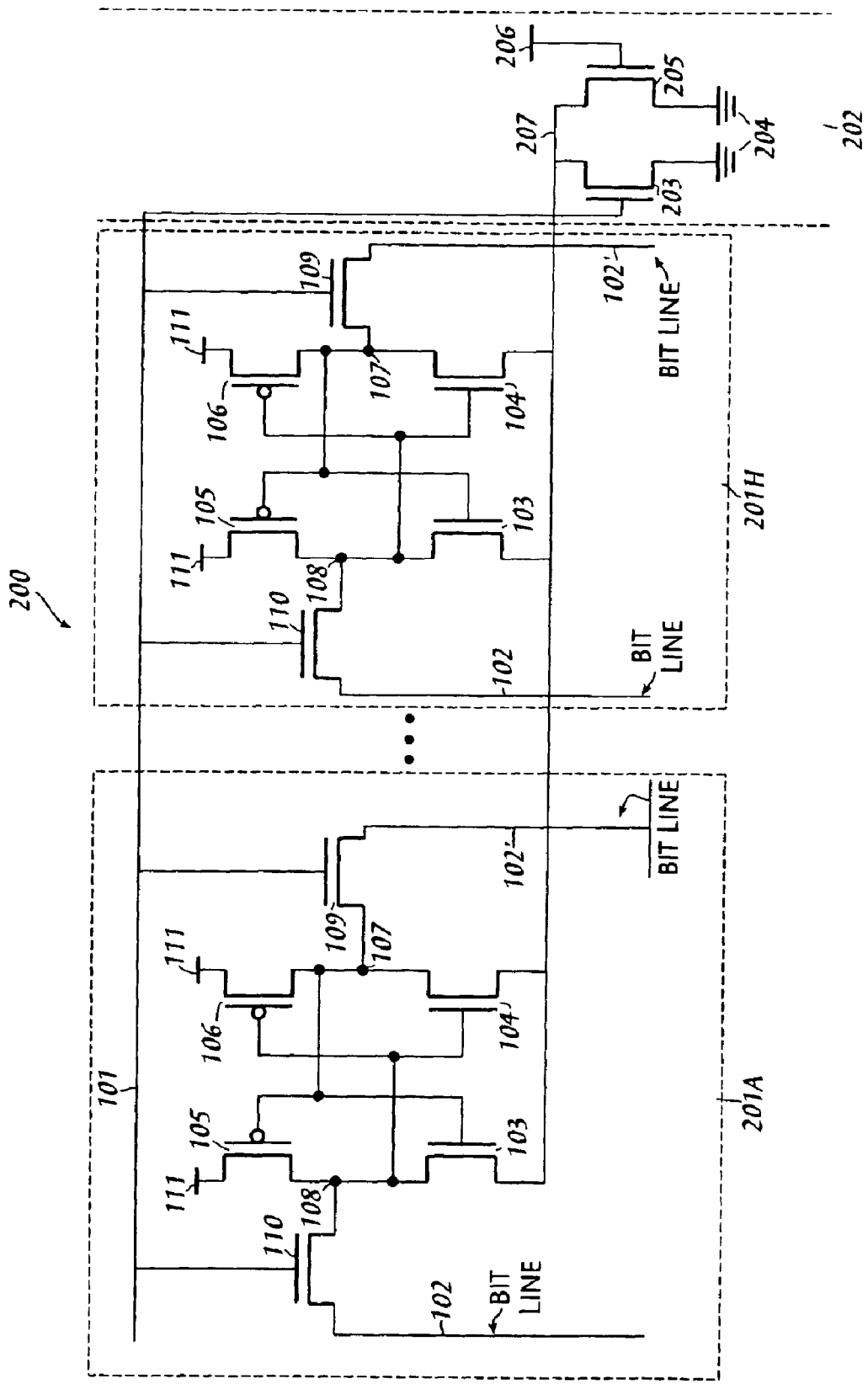
FIG. 2 illustrates one embodiment of the present invention of reducing sub-threshold leakage in the memory array by inserting a device in a ground path of a plurality of cells in the memory array.
Figure 3:
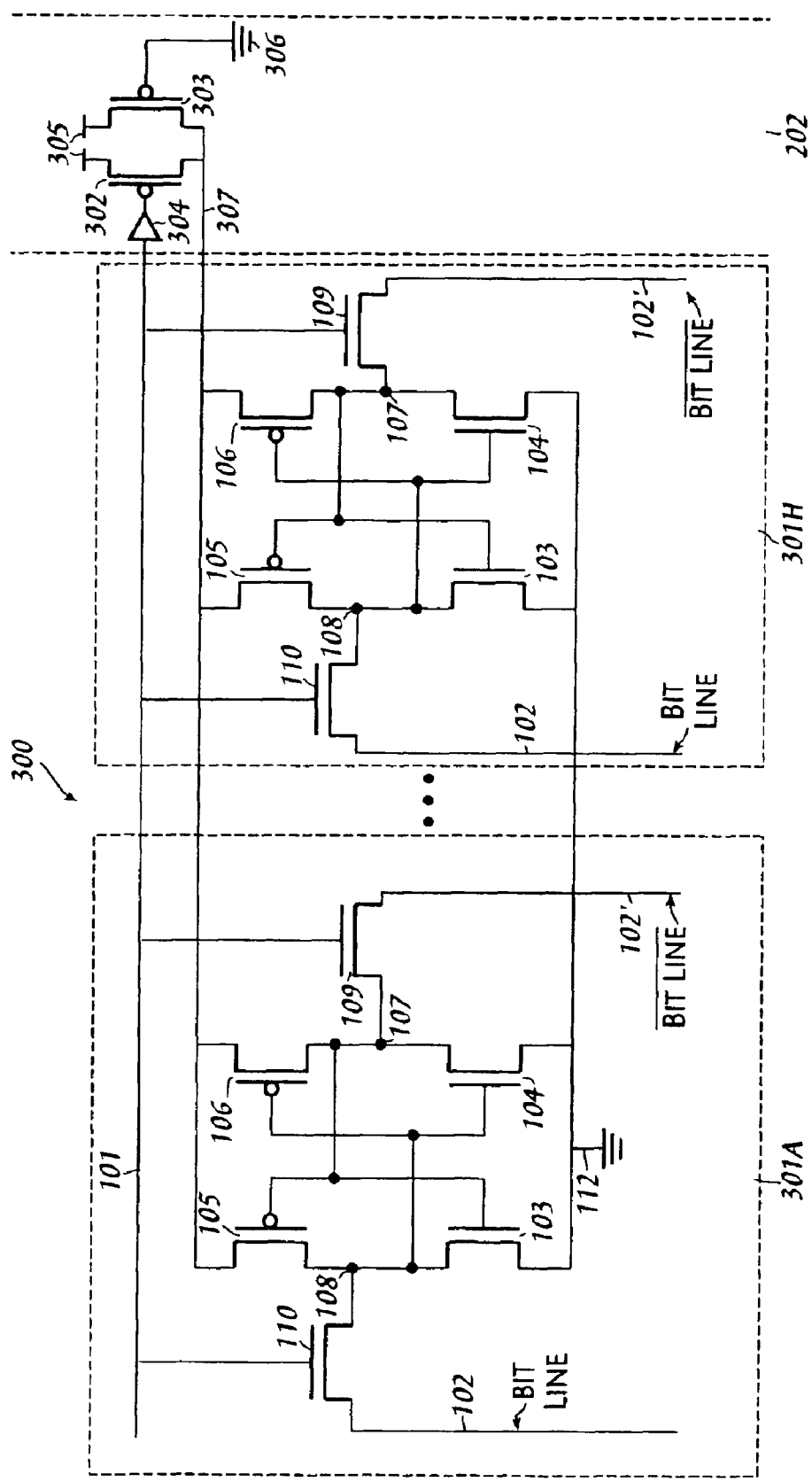
FIG. 3 illustrates one embodiment of the present invention of reducing sub-threshold leakage in the memory array by inserting a device in a power path of the plurality of cells in the memory array.
Figure 4:
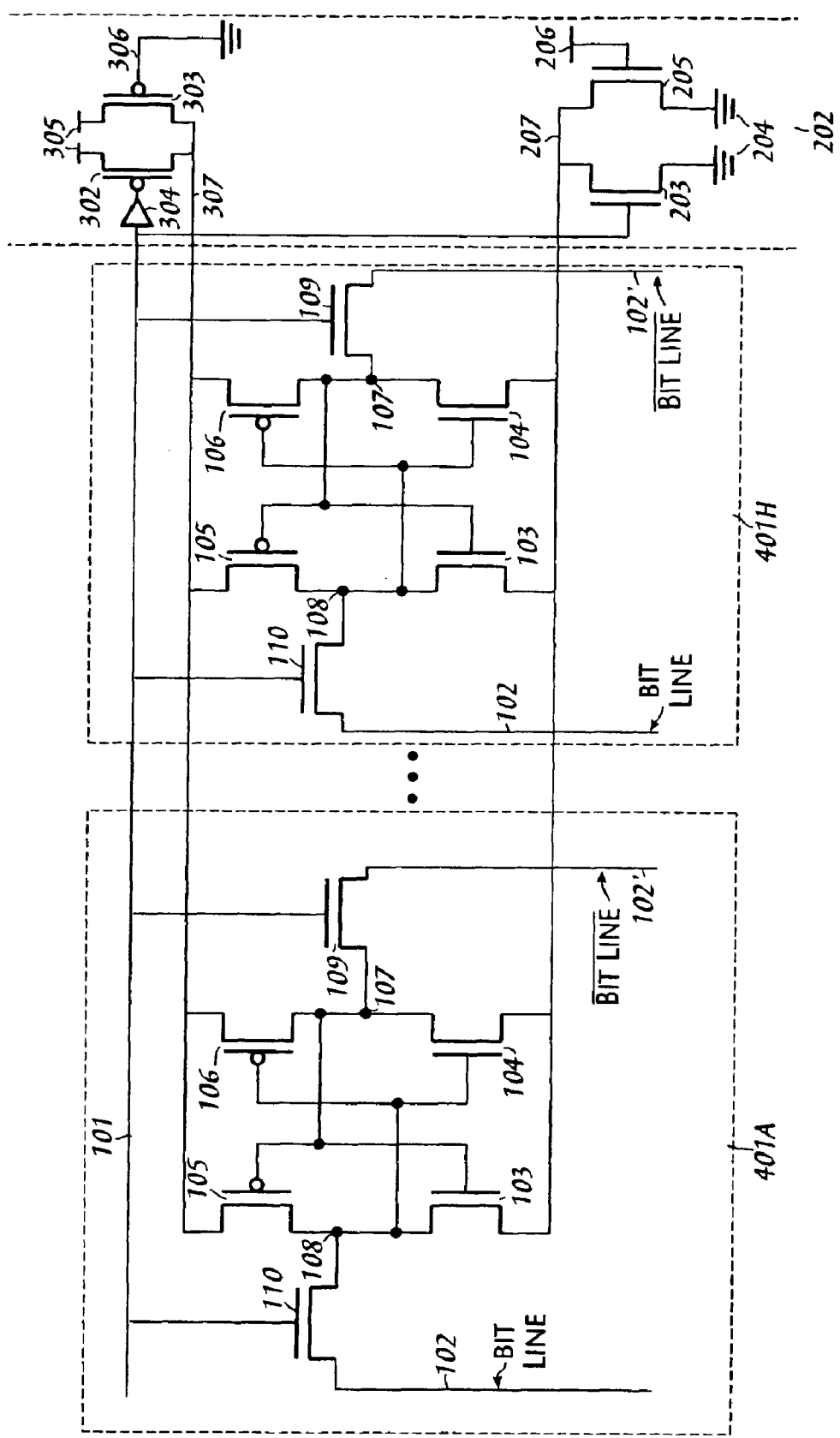
FIG. 4 illustrates one embodiment of the present invention of reducing sub-threshold leakage in the memory array by inserting one device in the ground path of the plurality of cells in the memory array and inserting another device in the power path of the plurality of cells in the memory array.
Figure 5:
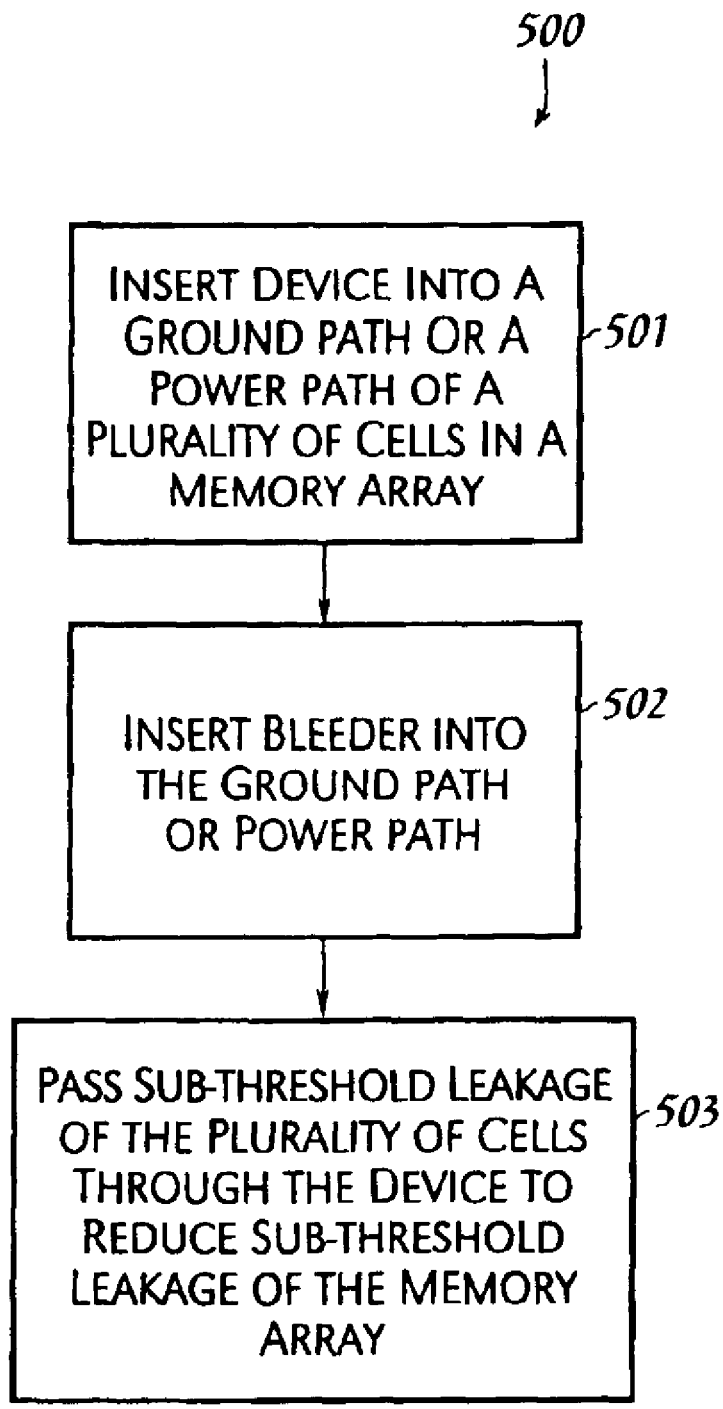
FIG. 5 is a flowchart of a method for reducing sub-threshold leakage in a memory array in accordance with the present invention.

As stated in the Background Information section, sub-threshold leakage may refer to the current that flows in the channel of the transistor when the transistor is deactivated, i.e., turned off. As illustrated in FIG. 1, cell 100 may experience sub-threshold leakage via channel leakage of transistors 103, 104, 105, 106 as a result of charging to/from nodes 107, 108. By inserting a device, e.g., transistor, in either the ground path or the power path of a group of cells 100 in a memory array, sub-threshold leakage may be reduced in memory arrays such as SRAM as described further below in FIGS. 2–5. FIG. 2 illustrates an embodiment of the present invention of reducing sub-threshold leakage in a memory array by inserting a device in a ground path of a plurality of cells in a memory array. FIG. 3 illustrates an embodiment of the present invention of reducing sub-threshold leakage in a memory array by inserting a device in a power path of a plurality of cells in a memory array. FIG. 4 illustrates an embodiment of the present invention of reducing sub-threshold leakage in a memory array by inserting one device in the ground path of a plurality of cells in the memory array and inserting another device in the power path of a plurality of cells in a memory array. FIG. 5 is a flowchart of a method for reducing sub-threshold leakage in a memory array.

FIG. 2—Reduce Sub-Threshold Leakage by Inserting a Device in Ground Path

FIG. 2 illustrates an embodiment of the present invention of a section (group of cells) 200 of a row of a memory array (not shown), e.g., SRAM, where a device, e.g., n-channel enhancement type field effect transistor, is inserted in a ground path of a plurality of cells in section 200. Referring to FIG. 2, memory array (not shown) may comprise a plurality of rows where each row may comprise one or more groups of cells 201A–H each electrically connected via a word line 101. Cells 201A–H may collectively or individually be referred to as cells 201 or cell 201, respectively. It is noted that a group of cells 201, e.g., cells 201A–H, may be separated from another group of cells 201 in the same row via a gap area 202. Section 200 of a row of a memory array may further comprise a device 203, e.g., n-type transistor, inserted in the ground path of the group of cells 201 to reduce the sub-threshold leakage of the group of cells 201 in section 200 as explained in further detail below. In one embodiment, device 203 may be inserted in gap area 202. Further, section 200 may comprise a device commonly referred to as a "bleeder" 205, e.g., n-type transistor, inserted in the ground path of the group of cells 201 to hold the states of cells 201 in section 200 when device 203 is deactivated. In one embodiment, bleeder 205 may be inserted in gap area 202. It is noted that device 203 and bleeder 205 may be located in other areas than gap area 202 but may be located in gap area 202 to minimize the area used by device 203 and bleeder 205. It is noted that the row in the memory array may comprise any number of groups of cells 201, e.g., cells 201A–H, separated by any number of gap areas 202. It is further noted that any number of cells 201 may comprise a group. It is further noted that the memory array (not shown), e.g., SRAM, may comprise any number of rows and that FIG. 2 is illustrative of a section 200 of a row in the memory array. It is further noted that the description below of section 200 applies to each section 200 in each row in the memory array.

Each cell 201 may be configured similarly to cell 100 (FIG. 1) except that the source of transistors 103, 104 may be coupled to the drain of n-type transistor 203 instead of ground 112 (FIG. 1). Further, word line 101 may be coupled to the gate of transistor 203 and the source of transistor 203 may be coupled to ground 204. By inserting transistor 203 in the ground path of the group of cells 201 in section 200, sub-threshold leakage may be reduced in the group of cells 201. Sub-threshold leakage may be reduced by effectively having multiple transistors, e.g., transistors 103 or 104 from each cell 201 and transistor 203, in series coupled to ground 204 instead of a single transistor 103, 104 coupled to ground 112 (FIG. 1). By having multiple transistors in series coupled to ground 204, a lesser amount of current (sub-threshold leakage) is leaked to ground when transistors 103, 104 and 203 are deactivated than when only transistor 103 or 104 is deactivated due to an increase in resistance in the resistive path and the body effect of transistors 103, 104. Hence, by having multiple transistors in series coupled to ground 204, sub-threshold leakage may be reduced. That is, by passing the sub-threshold leakage of the group of cells 201 through device 203, the sub-threshold leakage of the group of cells 201 may be reduced. By applying the above outlined concept of inserting device 203, e.g., n-type transistor, in the ground path of the group of cells 201 for each section 200 in each row in the memory array, the sub-threshold leakage may be reduced for the entire memory array.

As stated above, when device 203 is deactivated, bleeder 205 may be configured to hold the states of cells 201 in section 200. The drain of bleeder 205 may be coupled to the ground path, i.e., the source of transistors 103, 104. The source of bleeder 205 may be coupled to ground 204. The gate of bleeder 205 may be coupled to power 206 to thereby ensure constant activation. By ensuring bleeder 205 is constantly activated, bleeder 205 may be configured to hold the states of cells 201 in section 200 when device 203 is deactivated. That is, by bleeder 205 being constantly activated, bleeder 205 may be configured to prevent node 207 from floating. In one embodiment, bleeder 205 may be appropriately sized so that it has a L high threshold voltage and/or a long channel size to not itself cause excessive conduction of current.

Device 203, e.g., n-type transistor, may be sized, i.e., the size of the channel length may be adjusted, based on the ability to switch states if all cells 201 in the group need to switch states as well.

By having extra devices 203, 205, e.g., n-type transistors, in the group of cells 201, the switching power may be increased. Further, the larger the size of device 203, the greater the switching power may be increased. While the switching power may be increased, the overall power may still be reduced based on the power savings from reducing the sub-threshold leakage when cell 201 is not being written to or read from. As stated above, in SRAM, only one particular word line is accessed at a particular time. Hence, leakage power consumption may be reduced at any given time but when a word line is accessed thereby resulting in overall power savings despite the possible increase in switching power.

Further, by inserting devices 203, 205, in the ground path of a group of cells 201, the area of the group of cells 201 may be increased. In order to minimize the increase in area of the group of cells 201, devices 203, 205 may be inserted in gap area 202.

Referring to FIG. 2, device 203 may be an n-channel enhancement type field effect transistor. By inserting n-type device 203 into the ground path of n-type devices 103, 104, read performance may be impacted to a certain degree as n-type devices 103, 104 may be switched by pulling down bit lines 203, 203' during a read operation. By adding another n-type device 203 in series with devices 103, 104, it may increase the time to perform a read operation and hence affect performance. Hence, it may be desirable to add a p-type device coupled to the power path, i.e., the drain of p-type device may be coupled to the source of p-type transistors 105, 106, instead of adding a n-type device to the ground path as discussed further below in conjunction with FIG. 3. Since a p-type device, e.g., p-channel enhancement type field effect transistor, is not interfering with transistors 103, 104 switching during a read operation, performance may be improved. However, the embodiment of the n-type device inserted in the ground path may achieve greater reduction in sub-threshold leakage than the embodiment of the p-type device inserted in the power path, as n-type transistors 103, 104 experience greater sub-threshold leakage than p-type transistors 105, 106. N-type transistors 103, 104 experience greater sub-threshold leakage than p-type transistors 105, 106 as n-type transistors have greater mobility than p-type transistors and n-type transistors are generally larger in size than p-type transistors. In order to achieve the best sub-threshold leakage control, an n-type transistor device may be inserted in the ground path and a p-type transistor device may be inserted in the power path as described further below in conjunction with FIG. 4.

FIG. 3—Reduce Sub-Threshold Leakage by Inserting a Device in Power Path

FIG. 3 illustrates an embodiment of the present invention of a section (group of cells) 300 of a row of a memory array (not shown), e.g., SRAM, where a device, e.g., p-channel enhancement type field effect transistor, is inserted in a power path of a plurality of cells in section 300. It is noted that section 300 may be configured similarly as section 200 (FIG. 2) except as noted below. A device 302, e.g., p-type transistor, is inserted in the power path of the group of cells 301A–H to reduce the sub-threshold leakage instead of inserting an n-type transistor in the ground path of the group of cells 201 (FIG. 2). Further, a device 303, e.g., p-type transistor, is inserted in the power path of the group of cells 301A–H to hold the states of cells 301A–H in section 300 when device 302 is deactivated. Cells 301A–H may collectively or individually be referred to as cells 301 or cell 301, respectively. Further, the source of transistors 105, 106 in each cell 301 may be connected to the drain of device 302 instead of to power 111 as cell 201 (FIG. 2). Further, the source of transistors 103, 104 in cells 301 are connected to ground 112 instead of to the drain of device 203 (FIG. 2). As similarly noted in FIG. 2, it is noted that device 302 and bleeder 303 may be located in other areas than gap area 202 but may be located in gap area 202 to minimize the area used by device 302 and bleeder 303. It is noted that the row in the memory array (not shown) may comprise any number of groups of cells 301 separated by any number of gap areas 202. It is further noted that any number of cells 301 may comprise a group. It is further noted that the memory array (not shown), e.g., SRAM, may comprise any number of rows and that FIG. 3 is illustrative of a section 300 of a row in the memory array. It is further noted that the description below of section 300 applies to each section 300 in each row in the memory array.

As stated above, the source of transistors 105, 106 may be coupled to the drain of device 302, e.g., p-type transistor. Further, word line 101 may be coupled to the gate of transistor 302 via an inverter 304. The source of transistor 302 may be coupled to power 305. By inserting transistor 302 in the power path of the group of cells 301 in section 300, sub-threshold leakage may be reduced in the group of cells 301. Sub-threshold leakage may be reduced by effectively having multiple transistors, e.g., transistors 105 or 106 from each cell 301 and transistor 302, in series coupled to power 305 instead of a single transistor 105, 106 coupled to power 111 (FIG. 1). By having multiple transistors in series coupled to power 111, a lesser amount of current (sub-threshold leakage) is leaked to ground 112 when transistors 105, 106 and 302 are deactivated than when only transistor 105 or 106 is deactivated due to an increase in resistance in the resistive path and the body effect of transistors 105, 106. That is, by passing the sub-threshold leakage of the group of cells 301 through device 302, the sub-threshold leakage of the group of cells 301 may be reduced. By applying the above outlined concept of inserting device 302, e.g., p-type transistor, in the power path of the group of cells 301 for each section 300 in each row in the memory array, the sub-threshold leakage may be reduced for the entire memory array.

As stated above, when device 302 is deactivated, bleeder 303 may be configured to hold the states of cells 301 in section 300. The drain of bleeder 303 may be coupled to the power path, i.e., the source of transistors 105, 106. The source of bleeder 303 may be coupled to power 305. The gate of bleeder 303 may be coupled to ground 306 to thereby ensure constant activation. By ensuring bleeder 303 is constantly activated, bleeder 303 may be configured to hold the states of cells 301 in section 300 when device 302 is deactivated. That is, by bleeder 303 being constantly activated, bleeder 303 may be configured to prevent node 307 from floating. In one embodiment, bleeder 303 may be appropriately sized so that it has a high threshold voltage and/or a long channel size to not itself cause significant conduction of current.

Device 302, e.g., p-type transistor, may be sized, i.e., adjust the size of the channel length, based on the ability to switch states if all cells 301 in the group need to switch states as well.

Similarly, as described in the embodiment of FIG. 2, by having extra devices 302, 303, e.g., p-type transistors, in the group of cells 301, the switching power may be increased. Further, the larger the size of device 302, the greater the switching power may be increased. While the switching power may be increased, the overall power may still be reduced based on the power savings from reducing the sub-threshold leakage when cell 301 is not being written to or read from. As stated above, in SRAM, only one particular word line is accessed at a particular time. Hence, leakage power consumption may be reduced at any given time but when a word line is accessed thereby resulting in overall power savings despite the possible increase in switching power.

Further, as described above in connection with the embodiment of FIG. 2, by inserting devices 302, 303, in the power path of a group of cells 301, the area of the group of cells 301 may be increased. In order to minimize the increase in area of the group of cells 301, devices 302, 303 maybe inserted in gap area 202.

FIG. 4—Reduce Sub-Threshold Leakage by Inserting Devices in Ground Path and Power Path FIG. 4 illustrates an embodiment of the present invention of a section (group of cells) 400 of a row of a memory array (not shown), e.g., SRAM, where a device, e.g., n-channel enhancement type field effect transistor, is inserted in a ground path of a plurality of cells in section 400 and a device, e.g., p-channel enhancement type field effect transistor, is inserted in a power path of a plurality of cells in section 400. It is noted that FIG. 4 illustrates the embodiment of achieving the best sub-threshold leakage control by inserting an n-type transistor device in the ground path as taught in FIG. 2 and inserting a p-type transistor device in the power path as taught in FIG. 3. Hence, cells 401A–H are a combination of cells 201 (FIG. 2) and cells 301 (FIG. 3) as illustrated in FIG. 4. Cells 401A–H may collectively or individually be referred to as cells 401 or cell 401, respectively. Referring to FIG. 4, cell 401 has the sources of transistors 103, 104 coupled to the drain of transistors 203, 205 as described in FIG. 2. Further, cell 401 has the sources of transistors 105, 106 coupled to the drain of transistors 302, 303 as described in FIG. 3. A further description of FIG. 4 is avoided for the sake of brevity as the principles of the present invention as described in FIGS. 2 and 3 apply herein to FIG. 4. It is noted that FIG. 4 is illustrative.

FIG. 5—Method for Reducing Sub-Threshold Leakage in a Memory Array

FIG. 5 is a flowchart of one embodiment of the present invention of a method 500 for reducing sub-threshold leakage in a memory array, e.g., SRAM.

Referring to FIG. 5, in conjunction with FIGS. 2–4, in step 501, a device, e.g., n-type transistor 203, p-type transistor 302, may be inserted in a ground path or a power path of a plurality of cells, e.g., group of cells 201, group of cells 301, in a memory array. It is noted that in one embodiment, in step 501, a device, e.g., n-type transistor 203, may be inserted in a ground path of a plurality of cells, e.g., group of cells 201, and a device, e.g., p-type transistor 302, may be inserted in a power path of a plurality of cells, e.g., group of cells 301, concurrently.

In step 502, a bleeder device, e.g., bleeder 205, 303, may be inserted in the ground path or a power path of a plurality of cells, e.g., group of cells 201, group of cells 301, in a memory array. It is noted that in one embodiment, in step 502, a bleeder device, e.g., n-type transistor 205, may be inserted in a ground path of a plurality of cells, e.g., group of cells 201, and a bleeder device, e.g., p-type transistor 303, may be inserted in a power path of a plurality of cells, e.g., group of cells 301, concurrently.

In step 503, sub-threshold leakage of a plurality of cells, e.g., group of cells 201, group of cells 301, may pass through the device, e.g., n-type transistor 203, p-type transistor 302, inserted in step 501 to reduce the sub-threshold leakage of the memory array. In one embodiment, in step 503, sub-threshold leakage of a plurality of cells, e.g., group of cells 401, may pass through the devices, e.g., n-type transistor 203, p-type transistor 302, inserted in step 501 to reduce the sub-threshold leakage of the memory array.

It is noted that method 500 may be executed in a different order presented and that the order presented in the discussion of FIG. 5 is illustrative. It is further noted that certain steps in FIG. 5 may be executed almost concurrently.

Although the memory array and method are described in connection with several embodiments, it is not intended to be limited to the specific forms set forth herein; but on the contrary, it is intended to cover such alternatives, modifications and equivalents, as can be reasonably included within the spirit and scope of the invention as defined by the appended claims. It is noted that the headings are used only for organizational purposes and not meant to limit the scope of the description or claims.

What is claimed is:

1. A memory array, comprising:
   a first plurality of cells configured to store data, wherein each of said first plurality of cells is coupled to a ground path and a power path;
   a first device coupled to one of said ground and said power path, wherein said first device is configured to reduce sub-threshold leakage of said first plurality of cells; and
   a word line coupled to each of said first plurality of cells and a gate of said first device.

2. The memory array as recited in claim 1, wherein said ground path is coupled to a drain of said first device.

3. The memory array as recited in claim 1, wherein said power path is coupled to a drain of said first device.

4. A memory array, comprising:
   a first plurality of cells configured to store data, wherein each of said first plurality of cells is coupled to a ground path and a power path;
   a first device coupled to one of said ground and said power path, wherein said first device is configured to reduce sub-threshold leakage of said first plurality of cells; and
   a second device coupled to one of said ground path and said power path, wherein said second device is configured to hold said first plurality of cells' states when said first device is deactivated.

5. The memory array as recited in claim 4 further comprising:
   a gap area having power and word line contacts disposed therein; and
   a second plurality of cells coupled to said first plurality of cells via said gap area, wherein each of said second plurality of cells is coupled to said ground path and said power path.

6. The memory array as recited in claim 5, wherein said first device is inserted in said gap area.

7. The memory array as recited in claim 6, wherein said second device is inserted in said gap area.

8. A memory array, comprising:
   a first plurality of cells configured to store data, wherein each of said first plurality of cells is coupled to a ground path and a power path;
   a first device coupled to one of said ground and said power path, wherein said first device is configured to reduce sub-threshold leakage of said first plurality of cells; and
   a second device coupled to one of said ground and said power path, wherein said second device is coupled to a different path than said first device, wherein said second device is configured to reduce sub-threshold leakage of said first plurality of cells.

9. The memory array as recited in claim 8 further comprising:
   a word line coupled to each of said first plurality of cells, wherein said word line is coupled to a gate of said first and said second device.

10. The memory array as recited in claim 9, wherein said ground path is coupled to a drain of said first device, wherein said power path is coupled to a drain of said second device.

11. The memory array as recited in claim 10 further comprising:
    a third device coupled to one of said ground path and said power path; and
    a fourth device coupled to one of said ground path and said power path, wherein said fourth device is coupled to a different path than said third device;
    wherein said third and fourth device are configured to hold said first plurality of cells' states when said first and second device are deactivated, respectively.

12. The memory array as recited in claim 11 further comprising:
    a gap area having power and word line contacts disposed therein; and
    a second plurality of cells coupled to said first plurality of cells via said gap area, wherein said word line is coupled to each of said second plurality of cells, wherein each of said second plurality of cells is coupled to said ground path and said power path.

13. The memory array as recited in claim 12, wherein said first and said second devices are inserted in said gap area.

14. The memory array as recited in claim 12, wherein said third and said fourth devices are inserted in said gap area.

15. A method for reducing sub-threshold leakage in a memory array comprising the steps of:
    inserting a first device into one of a ground path and a power path coupled to a plurality of cells in said memory array, wherein said plurality of cells are configured to store data;
    passing sub-threshold leakage of said plurality of cells through said first device thereby reducing said sub-threshold leakage in said memory array; and
    inserting a second device into one of said ground path and said power path, wherein said second device is configured to hold said plurality of cells' states when said first device is deactivated.

16. The method as recited in claim 15, wherein said first and said second device are inserted in a gap area in said memory array.

* * * * *